United States Patent
Ohta et al.

(10) Patent No.: US 7,755,956 B2
(45) Date of Patent: Jul. 13, 2010

(54) NON-VOLATILE SEMICONDUCTOR MEMORY AND METHOD FOR REPLACING DEFECTIVE BLOCKS THEREOF

(75) Inventors: Hitoshi Ohta, Kanagawa-ken (JP); Tomohito Kawano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 12/129,384

(22) Filed: May 29, 2008

(65) Prior Publication Data

US 2008/0298126 A1 Dec. 4, 2008

(30) Foreign Application Priority Data

May 29, 2007 (JP) ............... 2007-142664

(51) Int. Cl.
*G11C 11/00* (2006.01)
(52) U.S. Cl. ....................... 365/200; 365/201
(58) Field of Classification Search ............. 365/200, 365/201
See application file for complete search history.

(56) References Cited

U.S. PATENT DOCUMENTS 6,065,141 A 5/2000 Kitagawa

| | | | |
|---|---|---|---|
| 2005/0007841 A1 | 1/2005 | Nagata et al. | |
| 2005/0231264 A1* | 10/2005 | Yoon | 327/526 |
| 2007/0002646 A1 | 1/2007 | Martin et al. | |
| 2007/0070734 A1* | 3/2007 | Hsu et al. | 365/200 |
| 2007/0113126 A1* | 5/2007 | Ong | 714/724 |

FOREIGN PATENT DOCUMENTS

JP 2004-192712 7/2004

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A non-volatile semiconductor memory includes a memory cell array. The memory cell array includes a plurality of banks, redundant blocks, and special blocks storing management data. Each bank includes a plurality of normal blocks, which include a plurality of electrically rewritable memory cells, the normal block being a minimum unit which is independently erased, and the redundant block configured to replace the normal block and being incapable of replacing the special block. A defective block automatic replacement sequence control circuit controls the replacement operation of the defective block FBLK with the redundant block RBLK in a defective block automatic replacement sequence.

25 Claims, 14 Drawing Sheets

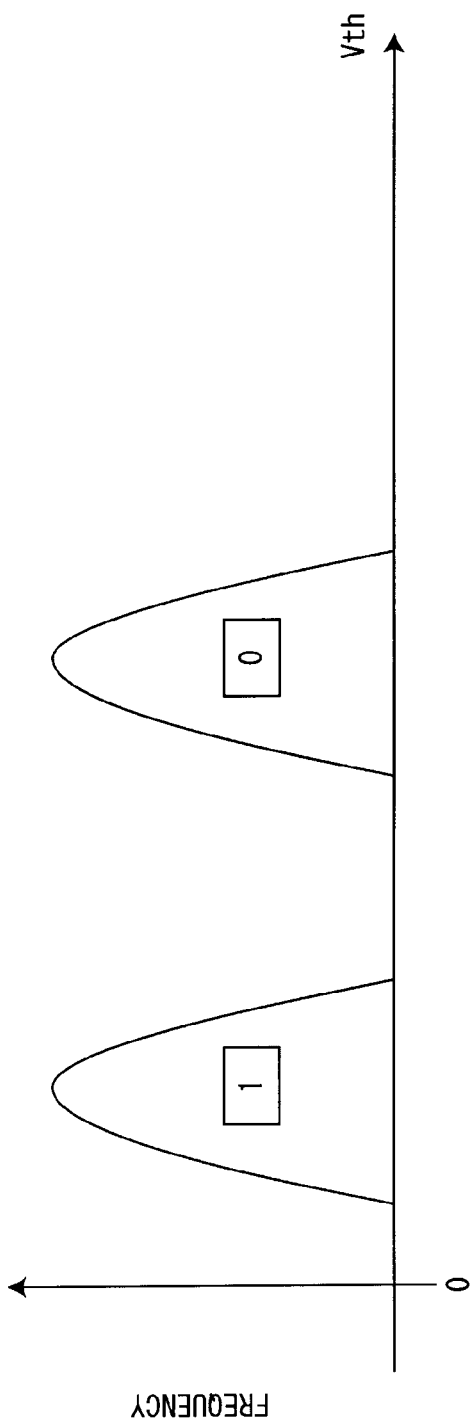
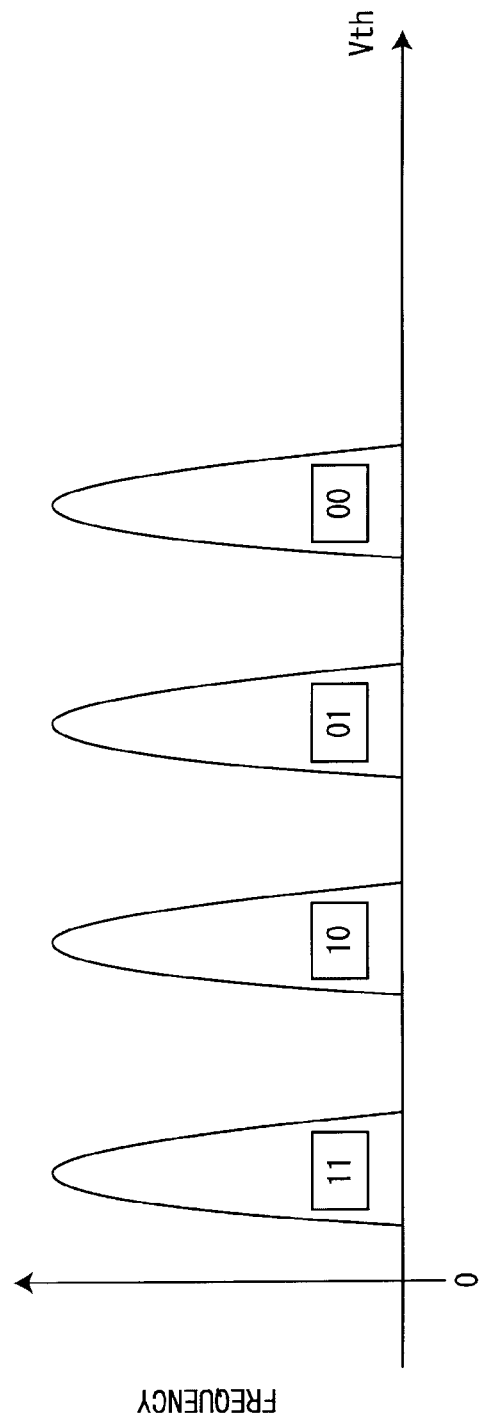

SECOND DEFECTIVE BLOCK MEMORY CIRCUIT

FIRST DEFECTIVE BLOCK MEMORY CIRCUIT

FIRST LOGIC CIRCUIT

SECOND LOGIC CIRCUIT

THIRD LOGIC CIRCUIT

| SELECTED BANK | SELECTED BLOCK | BANK ADDRESS | | | BLOCK ADDRESS | | | |
|---|---|---|---|---|---|---|---|---|
| | | BA<6> | BA<5> | BA<4> | BA<3> | BA<2> | BA<1> | BA<0> |
| BANK0 | BLK0 | 0 | 0 | 0 | 0 | 0 | 0 | 0 |
| | BLK1 | 0 | 0 | 0 | 0 | 0 | 0 | 1 |
| "A_BANK0" = "1" | BLK2 | 0 | 0 | 0 | 0 | 0 | 1 | 0 |
| "A_BANK1" = "0" | BLK3 | 0 | 0 | 0 | 0 | 0 | 1 | 1 |
| "A_BANK2" = "0" | BLK4 | 0 | 0 | 0 | 0 | 1 | 0 | 0 |
| "A_BANK3" = "0" | BLK5 | 0 | 0 | 0 | 0 | 1 | 0 | 1 |
| "A_BANK4" = "0" | BLK6 | 0 | 0 | 0 | 0 | 1 | 1 | 0 |
| "A_BANK5" = "0" | BLK7 | 0 | 0 | 0 | 0 | 1 | 1 | 1 |
| "A_BANK6" = "0" | BLK8 | 0 | 0 | 0 | 1 | 0 | 0 | 0 |
| "A_BANK7" = "0" | BLK9 | 0 | 0 | 0 | 1 | 0 | 0 | 1 |
| | BLK10 | 0 | 0 | 0 | 1 | 0 | 1 | 0 |
| BANK SELECTION | BLK11 | 0 | 0 | 0 | 1 | 0 | 1 | 1 |
| SIGNAL | BLK12 | 0 | 0 | 0 | 1 | 1 | 0 | 0 |
| | BLK13 | 0 | 0 | 0 | 1 | 1 | 0 | 1 |
| | BLK14 | 0 | 0 | 0 | 1 | 1 | 1 | 0 |
| | BLK15 | 0 | 0 | 0 | 1 | 1 | 1 | 1 |
| BANK1 | BLK0 | 0 | 0 | 1 | 0 | 0 | 0 | 0 |
| | BLK1 | 0 | 0 | 1 | 0 | 0 | 0 | 1 |
| "A_BANK0" = "0" | BLK2 | 0 | 0 | 1 | 0 | 0 | 1 | 0 |
| "A_BANK1" = "1" | BLK3 | 0 | 0 | 1 | 0 | 0 | 1 | 1 |
| "A_BANK2" = "0" | BLK4 | 0 | 0 | 1 | 0 | 1 | 0 | 0 |
| "A_BANK3" = "0" | BLK5 | 0 | 0 | 1 | 0 | 1 | 0 | 1 |
| "A_BANK4" = "0" | BLK6 | 0 | 0 | 1 | 0 | 1 | 1 | 0 |
| "A_BANK5" = "0" | BLK7 | 0 | 0 | 1 | 0 | 1 | 1 | 1 |
| "A_BANK6" = "0" | BLK8 | 0 | 0 | 1 | 1 | 0 | 0 | 0 |
| "A_BANK7" = "0" | BLK9 | 0 | 0 | 1 | 1 | 0 | 0 | 1 |
| | BLK10 | 0 | 0 | 1 | 1 | 0 | 1 | 0 |
| BANK SELECTION | BLK11 | 0 | 0 | 1 | 1 | 0 | 1 | 1 |
| SIGNAL | BLK12 | 0 | 0 | 1 | 1 | 1 | 0 | 0 |
| | BLK13 | 0 | 0 | 1 | 1 | 1 | 0 | 1 |
| | BLK14 | 0 | 0 | 1 | 1 | 1 | 1 | 0 |
| | BLK15 | 0 | 0 | 1 | 1 | 1 | 1 | 1 |

NON-VOLATILE SEMICONDUCTOR MEMORY AND METHOD FOR REPLACING DEFECTIVE BLOCKS THEREOF

CROSS-REFERENCE TO RELATED APPLICATIONS

This application is based upon and claims the benefit of priority from prior Japanese Patent Application No. 2007-142664, filed May 29, 2007, the entire contents of which are incorporated herein by reference.

FIELD OF THE INVENTION

The present invention relates to a non-volatile semiconductor memory and method for replacing defective blocks. For example, the present invention relates to a NOR type flash memory.

DESCRIPTION OF THE RELATED ART

Conventionally, the sorting test which distinguishes whether or not a memory chip, for example, a NOR type flash memory, functions normally has been performed. The increase of the time and cost for this sorting test is being enhanced with increase of the storage capacity of the memory chip by progress of scaling technology.

Then, many sorting tests by the BIST (Built In Self Test) method which performs the sorting test in the test circuit included in the memory chip itself are used in recent years. Japanese Patent Application Laid-Open Publication No. 2004-192712 discloses a sorting test by the BIST method.

In the sorting test by the BIST method, the block including the memory cell which was judged defective is stored as a defective block in the fail memory inside a tester, or the latch circuit inside a memory chip. This defective block is replaced by redundant blocks in a subsequent defective block replacement sequence.

SUMMARY

According to one aspect of the present invention, there is provided a non-volatile semiconductor memory comprising a memory cell array including a plurality of banks, redundant blocks, and special blocks, each bank including a plurality of normal blocks, each normal block including a plurality of electrically rewritable memory cells and being a minimum unit which is independently erased, the special block storing management data, the redundant block configured to replace the normal block and being incapable of replacing the special block; a plurality of first defective block memory circuits configured to store data which indicates whether respective normal blocks include a defective memory cell; a plurality of second defective block memory circuits configured to store data which indicates whether respective special blocks include a defective memory cell; a plurality of first logic circuits configured to indicate whether respective banks include a defective memory cell based on the data stored in the plurality of first defective block memory circuits; a second logic circuit configured to indicate whether respective special blocks include a defective memory cell based on the data stored in the second defective block memory circuit; and a third logic circuit configured to indicate whether the memory cell array includes a defective memory cell based on signals outputted from the plurality of first logic circuits and the second logic circuit.

According to another aspect of the present invention, there is provided a method for replacing defective blocks of a non-volatile semiconductor memory including a memory cell array, the memory cell array including a plurality of banks, redundant blocks, and special blocks, each bank including a plurality of normal blocks, each normal block including a plurality of electrically rewritable memory cells and being a minimum unit which is independently erased, the special block storing management data, the redundant block configured to replace the normal block and being incapable of replacing the special block, including distinguishing whether a normal block includes a defective memory cell or a special block which includes a defective memory cell exists in the memory cell array; if the normal block including the defective memory cell or the special block including the defective memory cell exists in the memory cell array, distinguishing whether the special block including a defective memory cell exits in the memory cell array; if the special block including the defective memory cell does not exist in the memory cell array, distinguishing whether each of the normal blocks inside the bank includes a defective memory cell; and replacing the normal block including the defective memory cell with the redundant block.

According to another aspect of the present invention, there is provided a method of testing a semiconductor memory having banks containing blocks including data blocks and at least one redundant block, and having at least one management data block, including determining whether a defective block is present in a bank of the memory; terminating the testing if no defective block is found; determining whether the at least one management block in the bank is defective if a defective block is found; determining the memory to be defective if the at least one management block is defective; determining whether a first number of defective blocks is more than a second number of redundant blocks in the bank if the at least one management block is not defective; determining the memory to be defective if the first number is greater than the second number; and replacing a defective block with one of the redundant blocks if the first number is not greater than the second number.

BRIEF DESCRIPTION OF THE DRAWINGS

FIG. 4A, 4B are schematic views of threshold distributions in memory cells on a NOR type flash memory in accordance with an embodiment of the present invention.

FIG. 11 is a schematic view of block addresses and bank addresses on a NOR type flash memory in accordance with an embodiment of the present invention.

DETAILED DESCRIPTION OF THE EXEMPLARY EMBODIMENTS

Hereafter, an embodiment of the present invention is explained with reference to the drawings.

Figure 1:
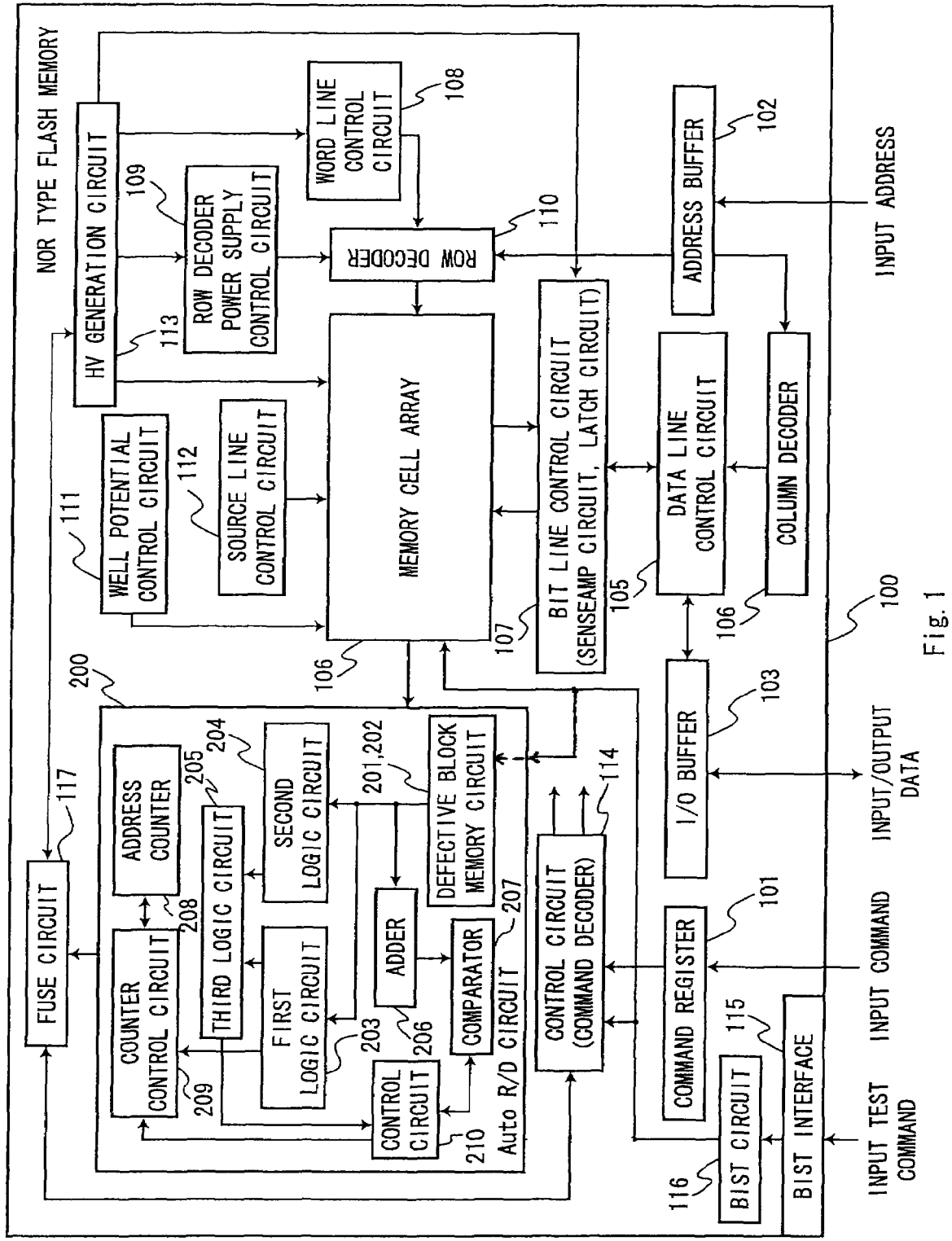
FIG. 1 is a block diagram of a NOR type flash memory in accordance with an embodiment of the present invention.

FIG. 1 is a block diagram of a non-volatile flash memory, such as, the NOR type flash memory 100 in accordance with an embodiment of the present invention.

The NOR type flash memory 100 includes a command register 101, an address buffer 102, a data input/output buffer (I/O buffer) 103, a column decoder 104, a data line control circuit 105, a memory cell array 106, a bit line control circuit 107, a word line control circuit 108, a row decoder power supply control circuit 109, a row decoder 110, a well potential control circuit 111, a source line control circuit 112, a high voltage generation circuit 113, a control circuit (command decoder) 114, a BIST interface 115, a BIST circuit 116, a fuse circuit 117, and a defective block automatic replacement sequence control circuit 200.

The command register 101 temporarily stores a command inputted into the NOR type flash memory 100 from an external host system, and transmits the command to the control circuit 114. The address buffer 102 temporarily stores an address inputted into the NOR type flash memory 100 from an external host system, and a column address is transmitted to the column decoder 104, and a row address is transmitted to the row decoder 110.

The data input/output buffer (I/O buffer) 103 temporarily stores data inputted into the NOR type flash memory 100 from an external host system, and transmits the data to the bit line control circuit 107 through the data line control circuit 105. Moreover, in case data is outputted to an external host system from the NOR type flash memory 100, the data input/output buffer (I/O buffer) 103 temporarily stores the data read through the data line control circuit 105.

The column decoder 104 decodes a column address transmitted from the address buffer 102, and transmits the decoded address to the data line control circuit 105. The data line control circuit 105 controls data input/output lines based on a column address transmitted from the column decoder 104, and transmits data inputted from the data input/output buffer 103 to the bit line control circuit 107 at the predetermined timing by directions of the control circuit 114, and transmits the data read through the bit line control circuit 107 to the data input/output buffer 103.

Figure 2:
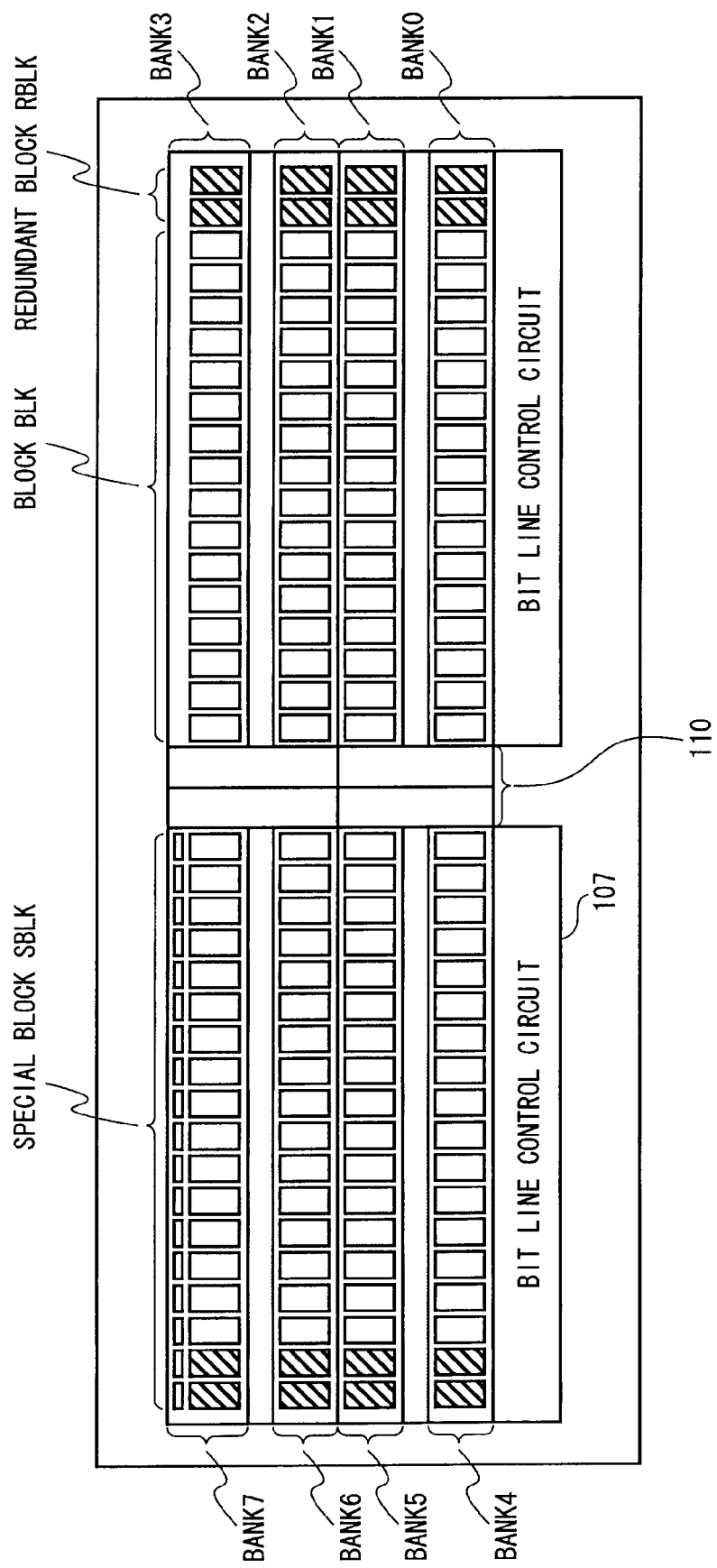
FIG. 2 is a block diagram of a memory cell array on a NOR type flash memory in accordance with an embodiment of the present invention.

As shown in FIG. 2, the memory cell array 106 includes a plurality of blocks BLK as a smallest erasable unit. The block BLK is constituted of a plurality of electrically rewritable memory cells MC. FIG. 2 illustrates a block diagram of the memory core region on the NOR type flash memory 100 in accordance with an embodiment of the present invention. The NOR type flash memory 100 is used as storage regions for a program code or user data, and the storage capacity of one block BLK is, for example, 128 kB.

Moreover, the memory cell array 106 includes redundant blocks RBLK used for replacement of defective blocks BLK which contains a defective memory cell MC. The memory cell MC which was judged defective in a test process (mentioned hereinafter) is defined as a defective memory cell MC. The redundant block RBLK has the same structure as the above-mentioned normal block (data block) BLK, and the storage capacity is also set to 128 kB.

Moreover, the memory cell array 106 includes special blocks (management data blocks) SBLK which cannot be replaced with the redundant blocks RBLK. The special block SBLK cannot be relieved by the redundant block RBLK even if a defective memory cell is included inside the special block SBLK.

The special blocks SBLK are used as a storage region of management data for the NOR type flash memory 100, for example, as boot blocks which store preset information. The storage capacity (the number of the memory cells MC) of the special block SBLK may be differ from the (normal) block BLK or the redundant block RBLK.

Moreover, the memory cell array 106 is divided into a unit called a bank BANK. The bank BANK is the minimum unit to (from) which data-writing and data-reading are executed simultaneously in parallel. In the present embodiment, the memory cell array 106 includes 8 banks BANK0 to BANK7.

The bank BANK is constituted by arranging 16 blocks BLK and 2 redundant blocks RBLK. In addition, in FIG. 2, although the redundant blocks RBLK are arranged at a right end in the banks BANK0 to BANK3 and are arranged at a left end in the banks BANK4 to BANK7, the redundant blocks RBLK may otherwise be arranged.

The defective block FBLK shall be replaced with the redundant block RBLK inside same bank BANK in the present embodiment. That is, in each bank BANK, 2 defective blocks FBLK are capable of being relieved by the redundant blocks RBLK. Moreover, the special block SBLK may be formed subsidiary to the interior of the any bank BANK (for example, the bank BANK7 as shown in FIG. 2), or may be formed independently in the exterior of the banks BANK.

Figure 3B:
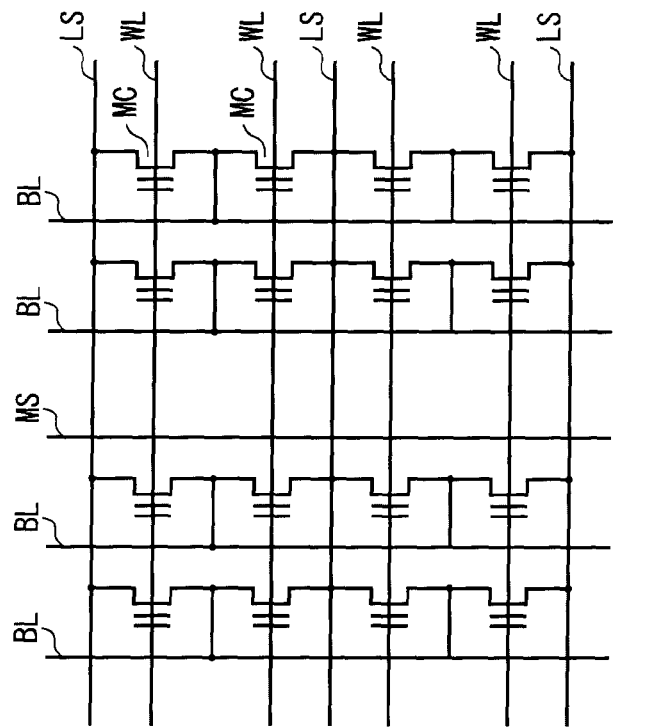
FIG. 3A, 3B are a schematic plan view and an equivalent circuit diagram of a memory cell array on a NOR type flash memory, respectively, in accordance with an embodiment of the present invention.
Figure 3A:
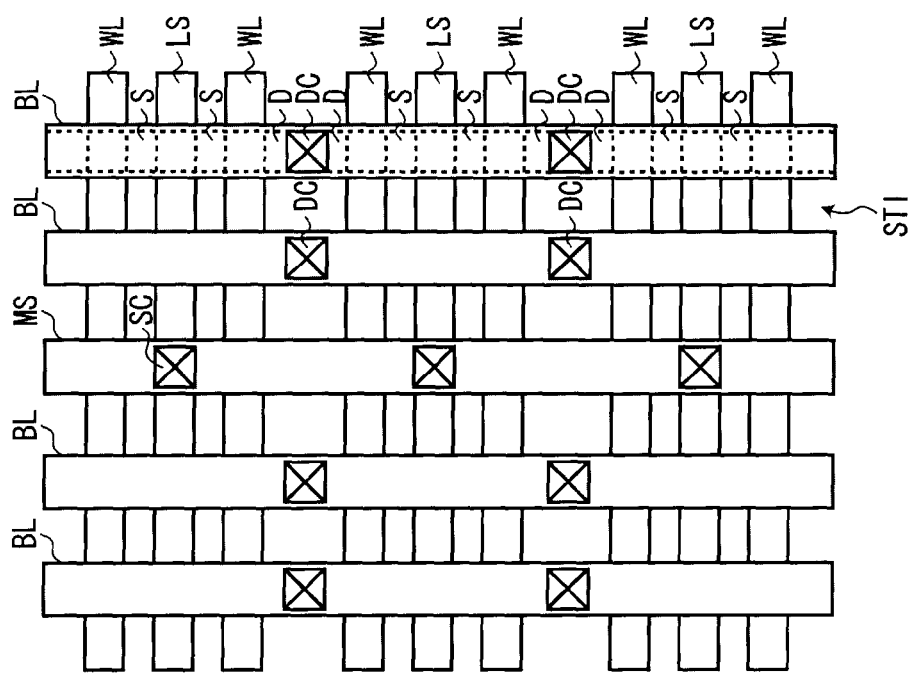

FIG. 3A illustrates a schematic plan view for a part of layout inside the block BLK in the memory cell array 106 in accordance with an embodiment of the present invention. FIG. 3B illustrates an equivalent circuit diagram for a part of the layout inside the block BLK in the memory cell array 106 in accordance with an embodiment of the present invention.

The memory cell MC shown in FIGS. 3A and 3B is arranged through the tunnel insulation layer on the P type well area formed in the N type well area in the P type silicon semiconductor substrate. In the P type well area, the n+ type source area S and the n+ type drain area D of the memory cell MC are formed separately from each other.

The memory cell MC has a two-layer gate structure which consists of a floating gate electrode and a control gate electrode. The memory cell MC can store data in a non-volatile state corresponding to change of the transistor threshold voltage in relation to the amount of electrons injected into the floating gate electrode.

As shown in FIG. 3A, two memory cells MC which are adjacent to each other share drain areas D, and two sets of two memory cells MC which are adjacent to each other share source areas S. Each memory cell MC is dissociated between the trench type isolation area (STI: Shallow Trench Isolation) in the row direction.

The control gate electrodes of the memory cells MC on the same line extend in the row direction, and form a plurality of word lines WL. Metal lines commonly connected to each source area S of the memory cell MC on the same line extend in the row direction, and form a plurality of local source lines LS.

Moreover, metal lines commonly connected to each drain area D of the memory cell MC on the same line extend in the column direction, and form a plurality of bit lines BL. Main source lines MS commonly contacted to the plurality of local source lines LS are arranged between the bit lines BL in a fixed interval.

When injecting electrons to the floating gate electrode in order to write data in the memory cell MC of the NOR type flash memory 100, grounding potential is supplied to the source area S, the P type silicon semiconductor substrate, the N type well area, and the P type well area. Moreover, potential so as to maximize the generating efficiency of electrons (channel hot electron) injected to the floating gate electrode is supplied to the control gate electrode and the drain area D through the word line WL and the bit line BL, respectively.

FIG. 4A, 4B illustrate schematic views of threshold distributions in the memory cells MC on the NOR type flash memory 100 in accordance with an embodiment of the present invention. As shown in FIG. 4A, the memory cell MC may store one of the binary data "1" and the binary data "0" in order of a threshold voltage, and as shown in FIG. 4B, the memory cell MC may store one of the 4 values data; data "11", data "10", data "01", and data "00" in order of a threshold voltage. In addition, assignment of data is not restricted to this coding.

The bit line control circuit 107 includes a sense amplifier circuit having a plurality of sense amplifiers and data latch circuit. The sense amplifier connected to each bit line BL of the memory cell array 106 loads data to the bit line BL, and detects potential of the bit line BL in order to store data in the data latch circuit. Moreover, the data read from the memory cell MC by the sense amplifier circuit controlled by the bit line control circuit 107 is outputted to an external host system through the data input/output buffer 103.

The word line control circuit 108 controls negative potential supplied to the word line WL at the time of erase operation based on a control signal generated by the control circuit 114. The row decoder power supply control circuit 109 transmits the high voltage generated by the high voltage generating circuit 113 to the row decoder 110. The row decoder 110 selectively drives the word line WL in the memory cell array 106 according to the row address transmitted from the address buffer 102.

The well potential control circuit 111 controls the potential of each well area formed on the P type silicon semiconductor substrate based on the control signal generated by the control circuit 114 according to various operations, such as data write, data read, and data erase.

The source line control circuit 112 controls the potential supplied to the local source line LS and the main source line MS based on the control signal which the control circuit 114 generates according to various operations, such as data write, data read, and data erase.

The high voltage generating circuit 113 generates the high voltage needed to various operations, such as data write, data read, and data erase based on the control signal which the control circuit 114 generates, and transmits the generated high voltage to the bit line control circuit 107, the word line control circuit 108, and the row decoder power supply control circuit 109.

The control circuit 114 controls operations of the various circuits in the NOR type flash memory 100 mentioned above based on the command transmitted from the command register 101. The BIST interface 115 transmits test commands supplied from an external tester to the BIST circuit 116.

The BIST circuit 116 detects whether or not the memory cell MC is defective by predetermined sequence based on the test commands transmitted from the BIST interface 115 in a test process. Information of the block BLK containing the memory cell MC which was judged as defective in this BIST sequence is stored in the first defective block memory circuit 201 as the defective block FBLK. Moreover, information of the special block SBLK containing the memory cell MC which was judged as defective in this BIST sequence is stored in the second defective block memory circuit 202 as the defective block FBLK.

The fuse circuit 117 stores the address of the defective block FBLK of the memory cell array 106 according to the defective block automatic replacement sequence mentioned later. When writing and reading data, the replacement of the defective block FBLK with the redundant block RBLK is possible by the comparator circuit (not shown) referring to the fuse circuit 117. Moreover, the test information used for BIST sequence or the number of the redundant block RBLK also may be stored in the fuse circuit 117.

The defective block automatic replacement sequence control circuit 200 includes the first defective block memory circuit 201, the second defective block memory circuit 202, the first logic circuit 203, the second logic circuit 204, the third logic circuit 205, the adder circuit 206, the comparator circuit 207, the address counter 208, the counter control circuit 209, and the control circuit 210. The defective block automatic replacement sequence control circuit 200 controls the replacement operation of the defective block FBLK with the redundant block RBLK in the defective block automatic replacement sequence mentioned hereinafter.

Figure 5B:
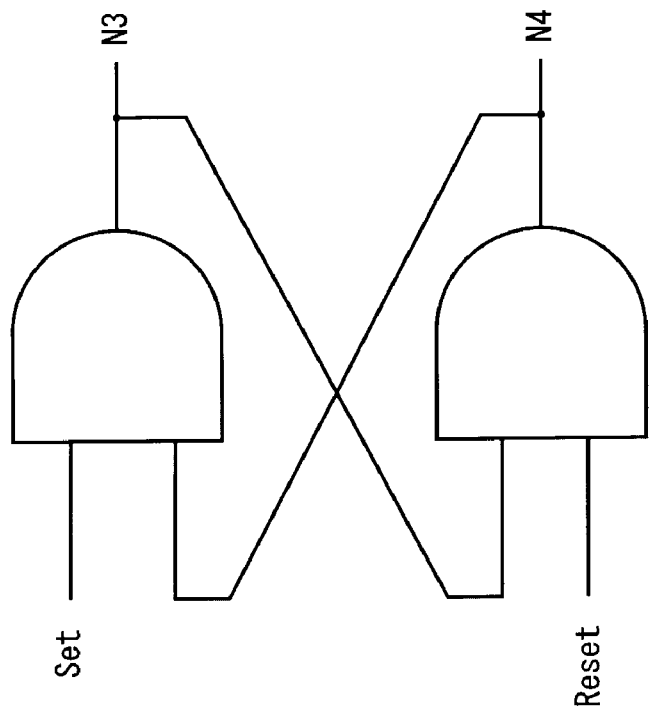
FIG. 5A, 5B are equivalent circuit diagrams of a first and second defective block memory circuit on a NOR type flash memory in accordance with an embodiment of the present invention.
Figure 5A:
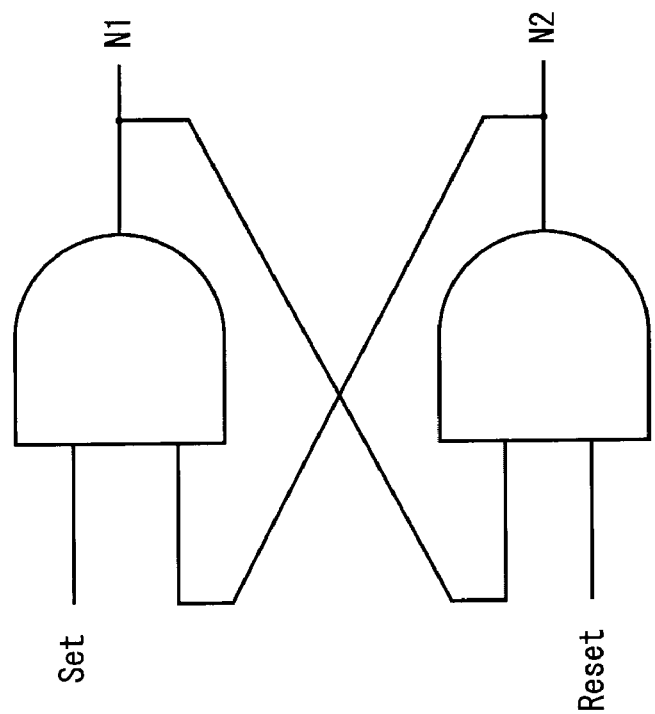

The first defective block memory circuit 201 is, for example, constituted of a latch circuit shown in FIG. 5A. The first defective block memory circuit 201 is prepared to each block BLK. If the block BLK includes the memory cell MC which was judged as defective in the BIST sequence mentioned above, data "A_i (i: $0<=i<=(m-1)$, m: the number of the blocks BLK inside the bank BANK (in case of the present embodiment, m=16)" which is stored on the data node N1 of the first defective block memory circuit 201 corresponding to the block BLK containing this defective memory cell MC is set to "A_i"="1" by the BIST circuit 116. On the other hand, data "A_i" which is stored on the data node N1 of the first defective block memory circuit 201 corresponding to the block BLK not containing the defective memory cell MC is set to "A_i"="0".

The second defective block memory circuit 202 is, for example, constituted of a latch circuit shown in FIG. 5B. The second defective block memory circuit 202 is prepared to each special block SBLK. If the special block BLK includes the memory cell MC which was judged as defective in the BIST sequence mentioned above, the data "A_bj (j: $0<=j<=(n-1)$, n: the number of the special blocks SBLK inside the memory cell array 106)" which is stored on the data node N3 of the second defective block memory circuit 202 corresponding to the special block SBLK containing this defective memory cell MC is set to "A_bj"="1" by the BIST circuit 116.

On the other hand, the data "A_bj" which is stored on the data node N3 of the second defective block memory circuit 202 corresponding to the special block SBLK not containing the defective memory cell MC is set to "A_bj"="0".

Figure 6:
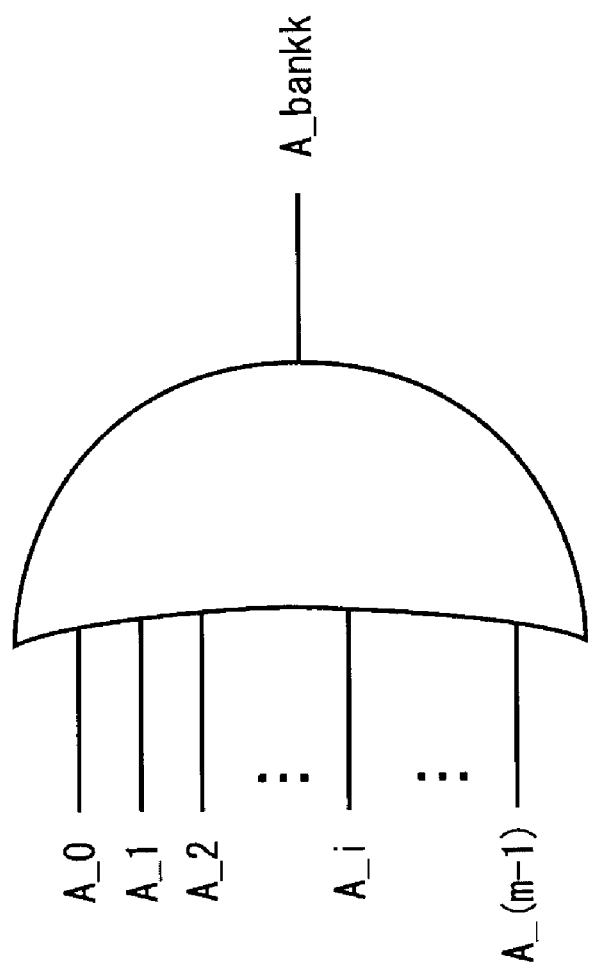
FIG. 6 is an equivalent circuit diagram of a first logic circuit on a NOR type flash memory in accordance with an embodiment of the present invention.

The first logic circuit 203 is, for example, constituted of an OR circuit shown in FIG. 6. The first logic circuit 203 is prepared to each bank BANK. The input signals for the first logic circuit 203 are the data "A_i" stored at the data node N1 of the plurality of first defective block memory circuit 201. Specifically, if at least one defective block FBLK exists in the each bank BANK (at least one data "A_i" is set to "A_i"="1"), the output signal from the first logic circuit 203 "A_bankk (k: 0<=k<=(p−1), p: the number of the banks BANK inside the memory cell array 106 (in the case of the present embodiment, p=8))" corresponding to this bank BANK becomes "A_bankk"="1".

On the other hand, if the defective block FBLK does not exist in the each bank BANK (all of data "A_i" is set to "A_i"="0"), the output signal from the first logic circuit 203 "A_bankk" corresponding to this bank BANK becomes "A_bankk"="0". Therefore, it becomes possible by detecting the logical level of the output signal "A_bankk" from the first logic circuit 203 to distinguish whether or not the defective block FBLK exists inside each bank BANK.

Figure 7:
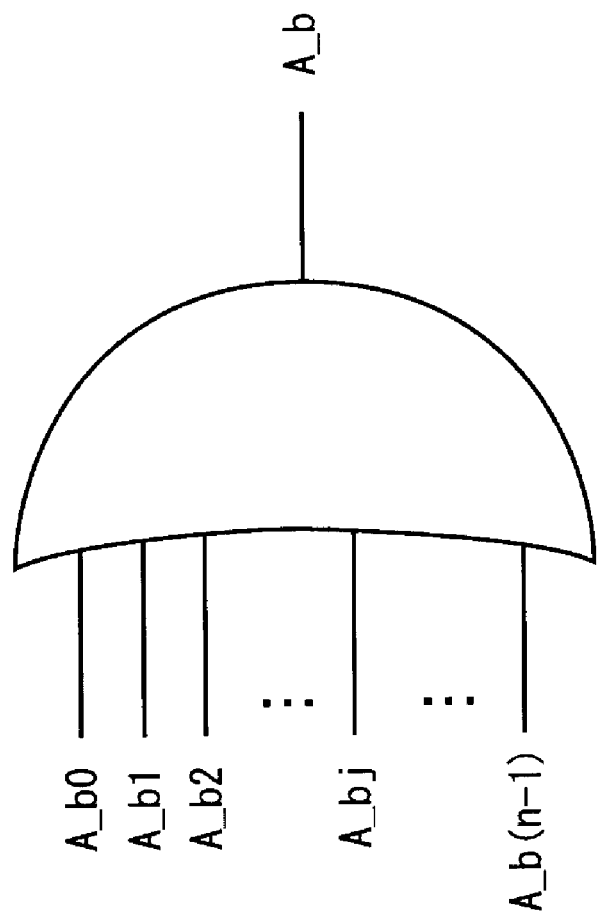
FIG. 7 is an equivalent circuit diagram of a second logic circuit on a NOR type flash memory in accordance with an embodiment of the present invention.

The second logic circuit 204 is, for example, constituted of an OR circuit shown in FIG. 7. The input signals for the second logic circuit 204 are the data "A_bj" stored at the data node N3 of the plurality of second defective block memory circuit 202. Specifically, if at least one defective block FBLK exists between the special blocks SBLK (at least one data "A_bj" is set to "A_bj"="1"), the output signal from the second logic circuit 204 becomes "A_b"="1".

On the other hand, if the defective block FBLK does not exist between the special blocks SBLK (all of data "A_bj" is set to "A_bj"="0"), the output signal from the second logic circuit 204 becomes "A_b"="0". Therefore, it becomes possible by detecting the logical level of the output signal "A_b" from the second logic circuit 204 to distinguish whether or not a defective block FBLK exists between the special blocks SBLK.

Figure 8:
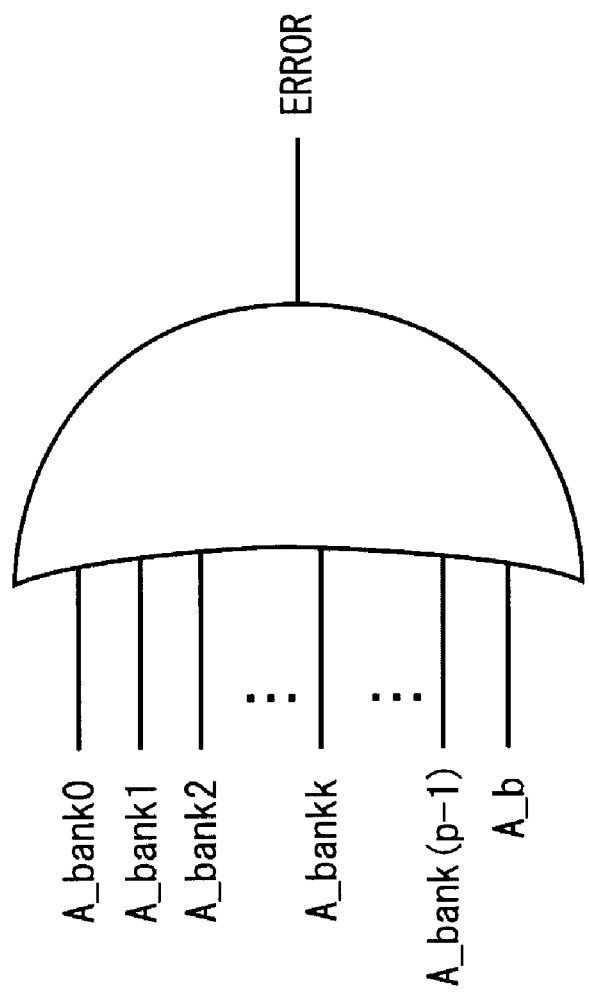
FIG. 8 is an equivalent circuit diagram of a third logic circuit on a NOR type flash memory in accordance with an embodiment of the present invention.

The third logic circuit 205 is, for example, constituted of an OR circuit shown in FIG. 8. The input signals for the third logic circuit 205 are the output signals "A_bankk" from the first logic circuit 203 corresponding to each bank BANK, and the output signal "A_b" from the second logic circuit 204. Specifically, if the defective block FBLK does not exist inside each bank BANK and the defective block FBLK does not exist between the special blocks SBLK (all of data "A_bankk" is set to "A_bankk"="0" and "A_b" is set to "A_b"="0"), the output signal "ERROR" from the third logic circuit 205 becomes "ERROR"="0".

On the other hand, if at least one defective block FBLK exists inside each bank BANK (at least one data "A_bankk" is set to "A_bankk"="1") or if at least one defective block FBLK exists between the special blocks SBLK ("A_b" is set to "A_b"="1"), the output signal "ERROR" from the third logic circuit 205 becomes "ERROR"="1". Therefore, it becomes possible by detecting the logical level of the output signal "ERROR" from the third logic circuit 205 to distinguish whether or not the defective block FBLK exists inside the memory cell array 106.

Figure 9:
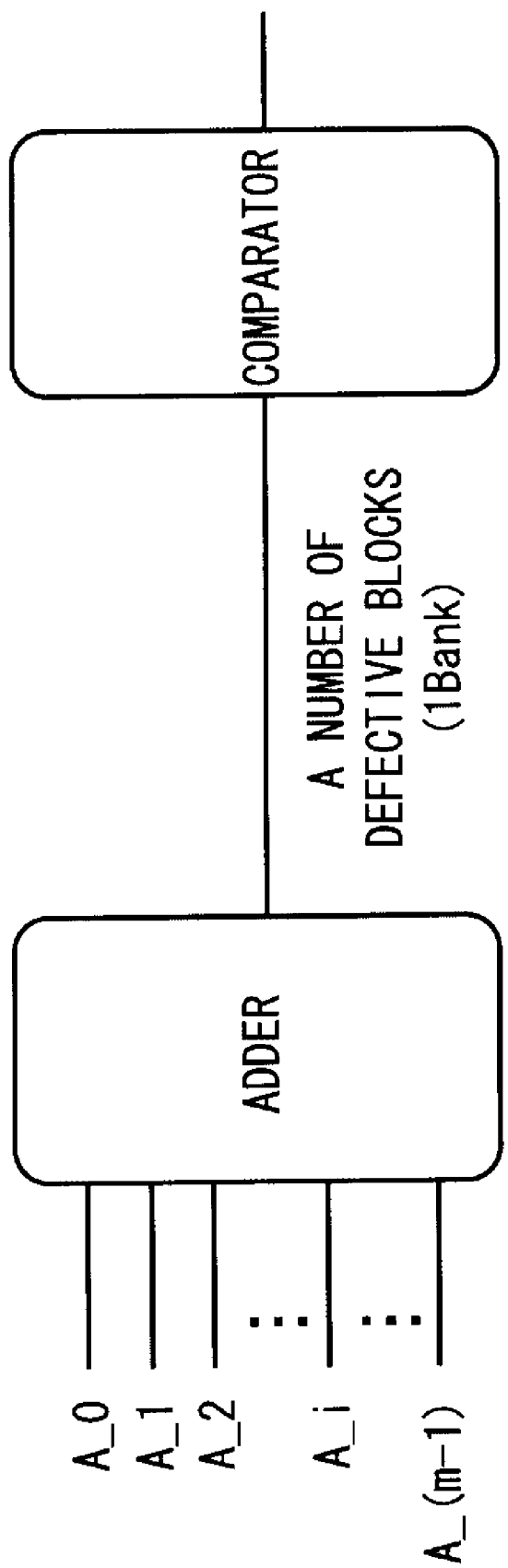
FIG. 9 is an equivalent circuit diagram of an adder and comparator on a NOR type flash memory in accordance with an embodiment of the present invention.

The adder 206 outputs the sum of the number of the defective blocks FBLK inside each bank BANK. That is, as shown in FIG. 9, the adder 206 bundles the output signals "A_i" from the first defective block memory circuit 201 corresponding to the block BLK inside each bank BANK, counts the number of data "1" (the number of the defective blocks FBLK), and outputs the signal according to the number of the defective blocks FBLK. FIG. 9 illustrates an equivalent circuit diagram of the adder 206 and the comparator 207 in accordance with an embodiment of the present invention.

As shown in FIG. 9, the comparator 207 compares the number of the defective blocks FBLK inside each bank BANK counted in the adder 206 with the number of the redundant blocks RBLK which can be used for replacement (in the present embodiment, the number is set to 2). The comparator 207 outputs the signal which differs according to whether or not the number of the defective blocks FBLK is more than the number of the redundant blocks RBLK. In addition, the adder 206 and the comparator 207 may be prepared for every bank BANK, or may be shared between two or more banks BANK and output a comparison result one by one.

Figure 10:
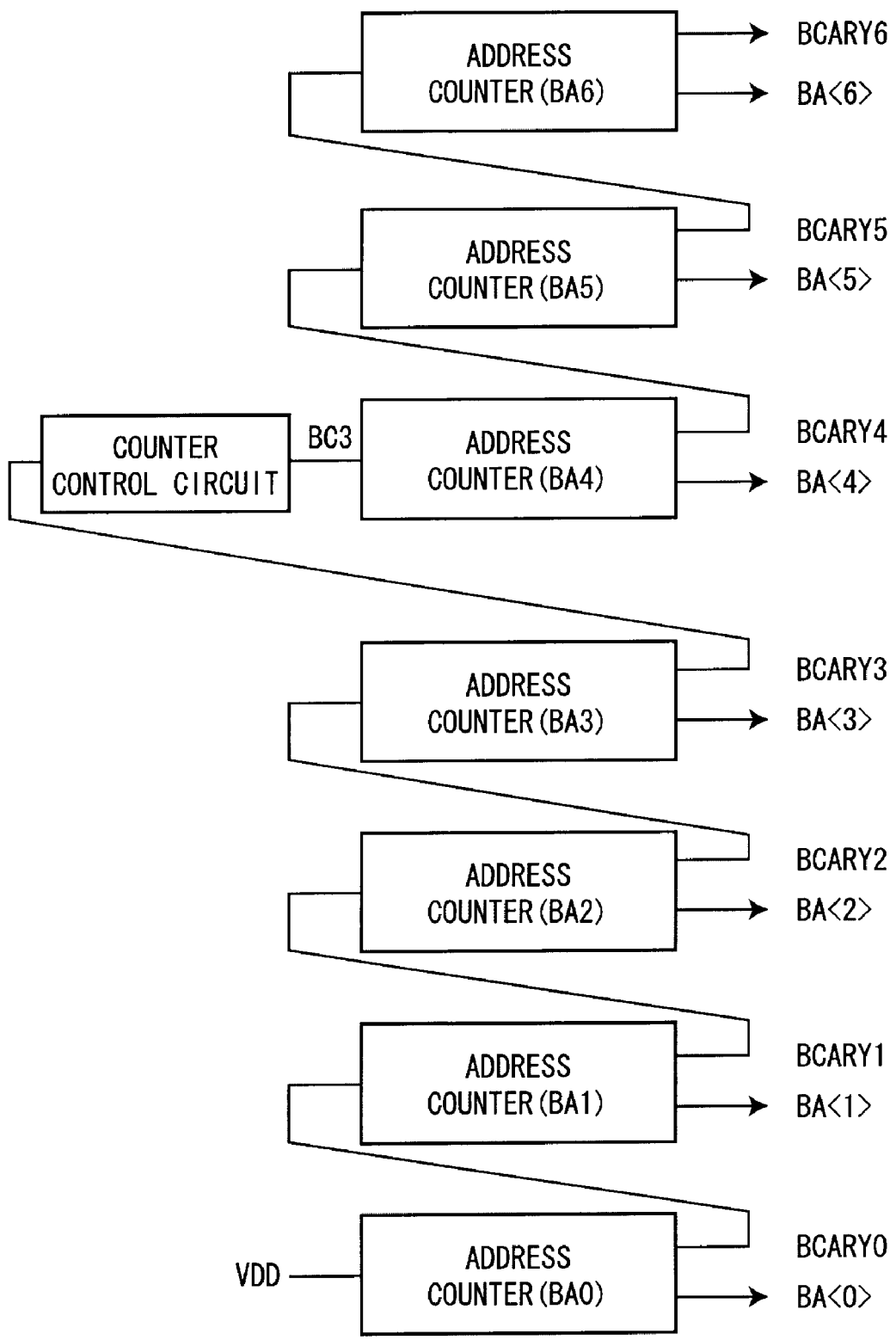
FIG. 10 is a block diagram of an address counter on a NOR type flash memory in accordance with an embodiment of the present invention.

The address counter 208 is, as shown in FIG. 10, constituted of 7 address counter circuits BA0 to BA6 (hereafter, generally may be called the address counter circuit BA). These address counter circuits BA specify block addresses BA <0:3> and bank addresses BA <4:6>, and select an arbitrary block BLK inside an arbitrary bank BANK.

The address counter circuit BA0 receives a clock pulse "VDD" as an input signal, and outputs block address BA <0> and the carry signal "BCARY0". The address counter circuit BA1 receives the carry signal "BCARY0" as an input signal, and outputs block address BA <1> and the carry signal "BCARY1". The address counter circuit BA2 receives the carry signal "BCARY1" as an input signal, and outputs block address BA <2> and the carry signal "BCARY2". The address counter circuit BA3 receives the carry signal "BCARY2" as an input signal, and outputs block address BA <3> and the carry signal "BCARY3".

The address counter circuit BA4 receives the bank address control signal "BC3" as an input signal which is an output signal of the counter control circuit 209 discussed below, and outputs bank address BA <4> and carry signal "BCARY4." The address counter circuit BA5 receives the carry signal "BCARY4" as an input signal, and outputs bank address BA <5> and carry signal "BCARY5." The address counter circuit BA6 receives the carry signal "BCARY5" as an input signal, and outputs bank address BA <6> and carry signal "BCARY6."

The relationship between the blocks BLK inside the bank BANK0 and the bank BANK1 and block addresses BA <0:3> and bank addresses BA <4:6> is shown in FIG. 11. The same relationship is applied to the block BLK inside the bank BANK2 to the bank BANK7.

Moreover, the bank selection signal in FIG. 11 is set to "1" for the bank BANK which the address counter 208 selects and is set to "0" for each other bank BANK, and is generated based on bank addresses BA <4:6>. For example, if the bank BANK0 is selected, "A_BANK0"="1", "A_BANK1" to "A_BANK7"="0", and if the bank BANK1 is selected, "A_BANK0"="0", "A_BANK1"="1", "A_BANK2" to "A_BANK7"="0."

Figure 12:
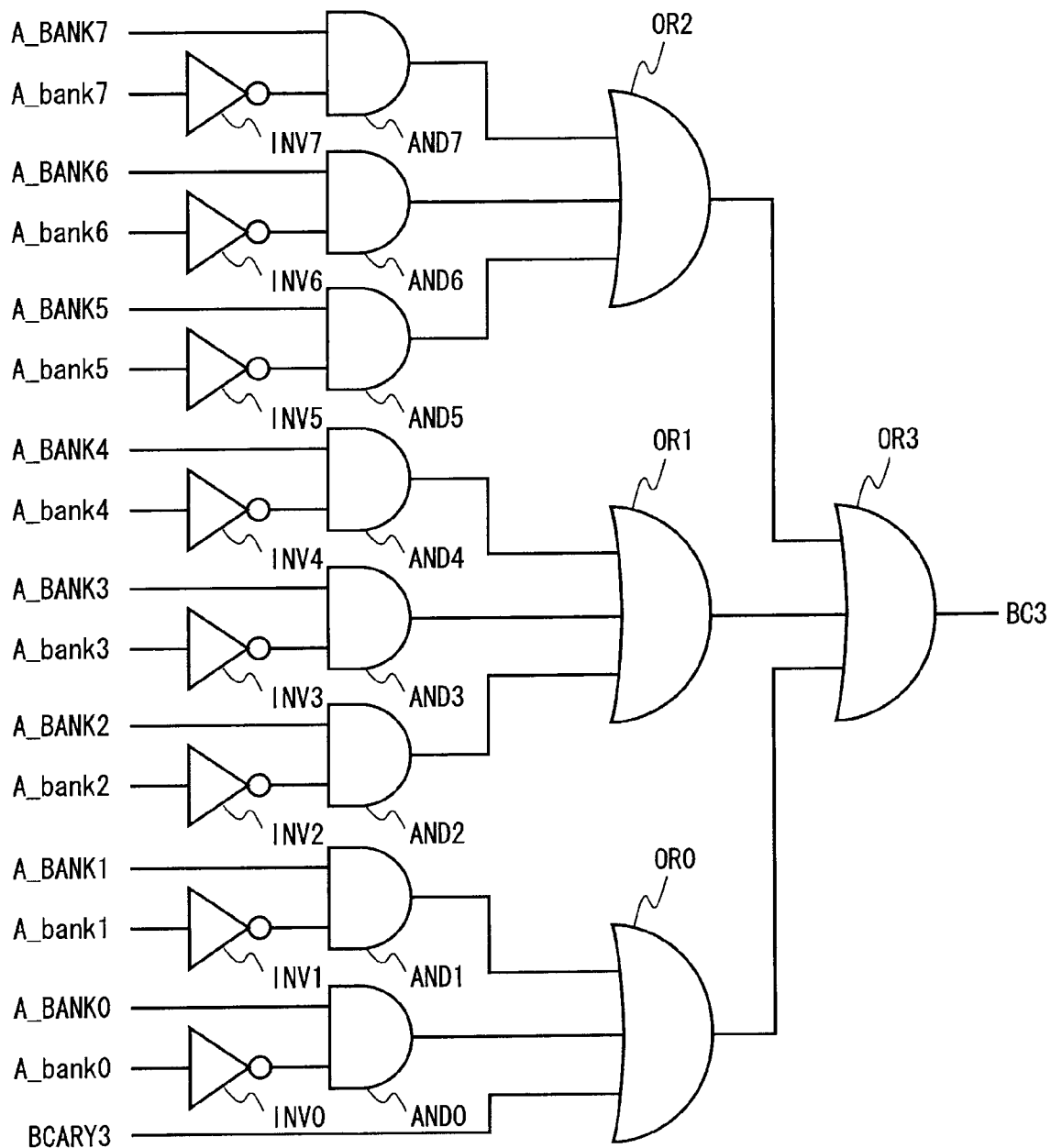
FIG. 12 is an equivalent circuit diagram of a counter control circuit on a NOR type flash memory in accordance with an embodiment of the present invention.

The counter control circuit 209 is connected in series between the address counter circuit BA3 and the address counter circuit BA4, as shown in FIG. 10. FIG. 12 illustrates an equivalent circuit diagram of the counter control circuit 209 in accordance with an embodiment of the present invention. As shown in FIG. 12, the counter control circuit 209 includes 8 inverter circuits INV0 to INV7, 8 AND circuits AND0 to AND7, and 4 OR circuits OR0 to OR3.

The inverter circuit INV0 receives the output signal "A_bank0" of the first logic circuit 203 corresponding to the bank BANK0 as an input signal. Similarly, the inverter circuits INV1 to INV7 receive the output signals "A_bank1" to "A_bank7" of the first logic circuit 203 corresponding to the bank BANK1 to the bank BANK7, respectively, as an input signal.

The AND circuit AND0 receives the output signal from the inverter circuit INV0, and receives the bank selection signal "A_BANK0" as an input signal. Similarly, the AND circuits AND1 to AND7 receive the output signals from the inverter circuits INV1 to INV7 and receive the bank selection signals "A_BANK1" to "A_BANK7", respectively, as an input signal.

The OR circuit OR0 receives the carry signal "BCARY3" which the address counter circuit BA3 outputs, and receives the output signals of the AND circuits AND0 and AND1 as an input signal. Moreover, the OR circuit OR1 receives the output signals of the AND circuits AND2 to AND4 as an input signal. Similarly, the OR circuit OR2 receives the output signal of the AND circuits AND5 to AND7 as an input signal.

Moreover, the OR circuit OR3 receives the output signals of the OR circuits OR0 to OR2 as an input signal, and outputs the bank address control signal "BC3". The bank address control signal "BC3" is an output signal of the counter control circuit 209. By inputting "BC3"="1" into the address counter circuit BA4, even if the carry signal "BCARY3"="0", the bank address BA <4> is compulsorily carried and the bank addresses BA <4:6> are incremented.

In other words, the address counter 208 and the counter control circuit 209 of the NOR type flash memory shown in FIG. 1 increment block addresses BA <0:3> and bank addresses BA <4:6> from "0000000" based on the input of the clock pulse "VDD". During incrementing of addresses BA <0:6>, the address counter 208 and the counter control circuit 209 select the bank BANK for 1 clock period in which the defective block FBLK is not detected.

After selecting the bank BANK for 1 clock period (after the bank selection signal "A_BANKk" corresponding to the bank BANK in which the defective block FBLK does not exist has been set to "1" for 1 clock period), the bank address control signal becomes "BC3"="1". Consequently, the counter control circuit 209 controls the address counter 208 so that bank addresses BA <4:6> are capable of transferring without transferring block addresses BA <0:3> from "0000" for the bank BANK in which the defective block FBLK is not detected.

In addition, the above mentioned circuits are but one example and the address counter 208 and the counter control circuit 209 may be realized by various constitutions so that bank addresses BA <4:6> are compulsorily transferred based on the output signal "A_bankk" of the first logic circuit 203 and the bank selection signal "A_BANKk".

The control circuit 210 controls operation of the various circuits inside the defective block automatic replacement sequence control circuit 200 in the defective block automatic replacement sequence described below, and controls replacement of the defective block FBLK with the redundant block RBLK.

Figure 13:
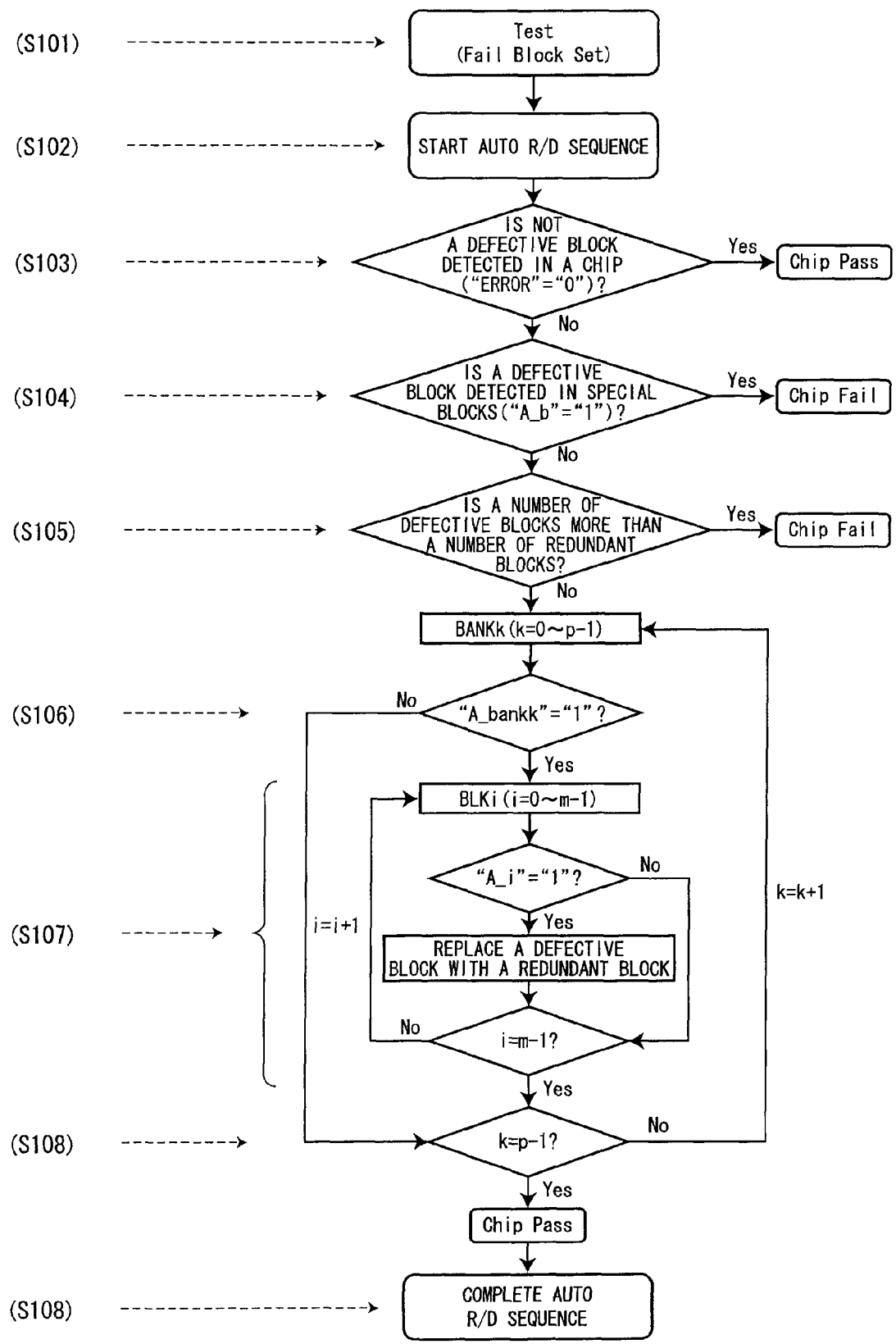
FIG. 13 is a flowchart of a defective block automatic replacement sequence on a NOR type flash memory in accordance with an embodiment of the present invention.

The defective block replacement sequence in the NOR type flash memory 100 which has above mentioned structure is explained with reference to the exemplary flow chart of FIG. 13. In addition, the flow chart is explained concretely, assuming that the block BLK3 inside the bank BANK1, and the block BLK7, the block BLK13 inside the bank BANK4 are the defective blocks FBLK, and the defective block FBLK does not exist between the special blocks SBLK.

The BIST circuit 116 starts a test process in the BIST sequence, and detects the defective memory cell MC inside the memory cell array 106. The data "A_i" which is stored on the data node N1 of the first defective block memory circuit 201 corresponding to the block BLK containing the memory cell MC which was judged as defective in the BIST sequence is set to "A_i"="1" as the defective block FBLK.

Moreover, also about the special block SBLK, the data "A_bj" which is stored on the data node N3 of the second defective block memory circuit 202 corresponding to the special block SBLK containing the memory cell MC which was judged as defective in the BIST sequence is set to "A_bj"="1" as the defective block FBLK.

Moreover, the data which is stored on the data node N1 of the first defective block memory circuits 201 corresponding to the blocks BLK which do not contain the defective memory cell is set to "A_i"="0", and the data which is stored on the data node N3 of the second defective block memory circuits 202 corresponding to the special blocks SBLK which do not contain the defective memory cell is set to "A_bj"="0".

In the present embodiment, since it is assumed that the block BLK3 inside the bank BANK1, and the blocks BLK7, BLK13 inside the bank BANK4 are the defective blocks FBLK, the data "A_3" which is stored on the data node N1 of the first defective block memory circuit 201 corresponding to the block BLK3 inside the bank BANK1 is set to "A_3"="1", the data "A_7" which is stored on the data node N1 of the first defective block memory circuit 201 corresponding to the block BLK7 inside the bank BANK4 is set to "A_7"="1", and the data "A_13" which is stored on the data node N1 of the first defective block storage circuit 201 corresponding to the block BLK13 inside the bank BANK4 is set to "A_13"="1".

The data stored on the data node N1 of the other first defective block memory circuits 201 are set to "A_i"="0". Moreover, since it is assumed that the defective block FBLK does not exist between the special blocks SBLK, the data stored on the data node N3 of the second defective block memory circuits 202 are set to "A_bj"="0" (Step S01).

After completing the data latch of the first defective block memory circuit 201 and the second defective block memory circuit 202 based on the result of the BIST sequence, the defective block automatic replacement sequence is started under control of the control circuit 210 (Step S102).

After the defective block automatic replacement sequence starts, the control circuit 210 distinguishes whether or not the defective block FBLK exists inside the NOR type flash memory 100 (inside the memory cell array 106) by detecting the logical level of the output signal "ERROR" of the third logic circuit 205.

If the defective block FBLK is not detected inside the NOR type flash memory 100, since the output signal "ERROR" of the third logic circuit 205 is "ERROR"="0", the defective block automatic replacement sequence ends as a chip PASS.

In the present embodiment, since it is assumed that the block BLK3 inside the BANK1, and the blocks BLK7, BLK13 inside the bank BANK4 are the defective blocks FBLK, the output signals "A_bankk" of the first logic circuits 203 are "A_bank0"="0", "A_bank1"="1", "A_bank2"="0", "A_bank3"="0", "A_bank4"="1", "A_bank5"="0", "A bank6"="0", and "A_bank7"="0".

Moreover, since it is assumed that the defective block FBLK does not exist between the special blocks SBLK, the output signal of the second logic circuit 204 is set to "A_b"="0". Therefore, the output signal "ERROR" of the third logic circuit 205 is set to "ERROR"="1" (Step S103).

If the defective block is detected inside the NOR type flash memory 100 ("ERROR"="1"), the control circuit 210 distinguishes whether or not the defective block FBLK exists between the special blocks SBLK by detecting the logical level of the output signal "A_b" of the second logic circuit 204.

If the output signal of the second logic circuit 204 is set to "A_b"="1", since the special block SBLK whose replacement is impossible with the redundant block RBLK is the defective block FBLK, the control circuit 210 ends the defective block automatic replacement sequence as a chip FAIL (chip relief is impossible).

In the present embodiment, since it is assumed that the defective block FBLK does not exist between the special blocks SBLK, as mentioned above, the output signal of the second logic circuit is set to "A_b"="0" (Step S104).

If the defective block FBLK does not exist between the special blocks SBLK ("A_b"="0"), the adder 206 counts the number of the defective blocks FBLK inside each bank BANK, and the comparator 207 compares the number of the defective blocks FBLK with the number of the redundant blocks RBLK which can be used for replacement.

If the number of the defective blocks FBLK is more than the number of the redundant blocks RBLK which can be used for replacement, since the remaining defective block cannot be relieved, the control circuit 210 ends the defective block automatic replacement sequence as a chip FAIL.

In the present embodiment, the number of the defective blocks FBLK inside the bank BANK1 is 1, the number of the defective blocks FBLK inside the bank BANK4 is 2, and the number of the redundant blocks RBLK which can be used for replacement in each bank BANK is 2. Therefore, since the number of the defective blocks FBLK inside each bank BANK does not exceed the number of the redundant blocks RBLK in each bank BANK which can be used for replacement, the defective block automatic replacement sequence is continued (Step S105).

If the number of the defective blocks FBLK is not more than the number of the redundant blocks RBLK which can be used for replacement, the control circuit 210 distinguishes whether or not the block BLK inside each bank BANK is the defective block FBLK based on the data "A_i" which is latched on the data node N1 of the first defective block memory circuit 201 by incrementing bank addresses BA <0:3> and block addresses BA <4:6> from "00000000" using the address counter 208.

If the selected bank BANK does not include the defective block FBLK inside ("A_bankk"="0"), the counter control circuit 209 generates the bank address control signal "BC3"="1". Consequently, the address counter 208 transfers bank addresses BA <4:6> to the following bank BANK without incrementing block addresses BA <0:3> from "0000".

In the present embodiment, since it is assumed that the defective block FBLK does not exist in the bank BANK0, the output signal of the first logic circuit 203 is set to "A_bank0"="0". In this condition, if the address counter 208 selects the bank BANK0 by setting block addresses BA <0:3> and bank addresses BA <4:6> to "00000000", the bank selection signal becomes "A_BANK0"="1", and the bank address control signal becomes "BC3"="1" by the counter control circuit 209.

Thereby, since bank address BA <4> is compulsorily incremented by 1, the address counter 208 selects bank BANK1 by transferring bank address <4:6> to "001" without incrementing block addresses BA <0:3> from "0000" (Step S106).

If the selected bank BANK includes the defective block FBLK inside ("A_bankk"="1"), since the bank address control signal "BC3" is set to "BC3"="0", the control circuit 210 inspects whether or not each of the blocks BLK0 to BLK15 inside the selected bank BANK is the defective block FBLK with reference to the data "A_i" which is stored on the data node N1 of the first defective block memory circuit 201 by incrementing block addresses BA <0:3> from "0000" to "1111".

In the selected bank BANK, during increment of block addresses BA <0:3> from "0000", if the address counter 208 selects the defective block FBLK for which the data latched on the data node N1 of the first defective block memory circuit 201 is set to "A_i"="1", the control circuit 210 executes the replacement operation of the defective block FBLK with the redundant block RBLK by programming the address of this defective block FBLK in the fuse circuit 117.

If the defective block FBLK is not the last block BLK15 inside the selection bank BANK, the address counter 208 further increments block addresses BA <0:3>, and distinguishes whether or not the block BLK is the defective block FBLK up to the last block BLK15 whose block addresses are "1111".

In the present embodiment, since the defective block FBLK exists inside the bank BANK1, the output signal of the first logic circuit 203 is set to "A_bank1"="1". If the address counter 208 selects the bank BANK1 by incrementing bank addresses BA <4:6> to "001" and the bank selection signal is set to "A_BANK1"="1", the bank address control signal becomes "BC3"="0." Therefore, the control circuit 210 inspects whether or not each of the blocks BLK0 to BLK15 inside the bank BANK1 is the defective block FBLK with reference to the data "A_i" which is stored on the data node N1 of the first defective block memory circuit 201.

If block addresses BA <0:3> are set to "0011" and the address counter 208 selects the block BLK3, since the block BLK3 is registered as the defective block FBLK at the data node N1 of the first defective block memory circuit 201 ("A_3"="1"), the control circuit 210 programs this address in the fuse circuit 117. After programming the address, the address counter 208 further increments block addresses BA <0:3>, and the control circuit 210 distinguishes each block BLK one by one up to the last block BLK15 inside the bank BANK1 (Step S107).

If the control circuit 210 has distinguished whether or not each of the block BLK is the defective block FBLK up to the last block BLK15 inside the selected bank BANK in case the selected bank BANK includes at least one defective block FBLK, or if the control circuit 210 has detected that the selected bank BANK does not include the defective block FBLK, the control circuit 210 distinguishes whether or not the selected bank BANK is the last bank BANK7 whose bank addresses <4:6> are "111". If the selected bank BANK is not the last bank BANK7, the address counter 208 increments bank addresses <4:6>.

In the present embodiment, if the control circuit 210 has distinguished whether or not each of the block BLK is the defective block FBLK up to the last block BLK15 (block addresses BA <0:3> are "1111") inside the bank BANK1, the carry signal becomes "BCARY3"="1" and the bank address control signal becomes "BC3"="1" by the counter control circuit 209. Thereby, the address counter 208 transfers bank addresses BA <4:6> and selects the bank BANK2.

If the bank BANK2 is selected, the bank selection signal becomes "A_BANK2"="1". Since the bank BANK2 does not include the defective block FBLK, the output signal of the first logic circuits 203 is set to "A_bank2"="0" and the bank address control signal is set to "BC3"="1". Thereby, the address counter 208 transfers bank addresses BA <4:6> and selects the bank BANK3.

If the bank BANK3 is selected, the bank selection signal becomes "A_BANK3"="1". Since the bank BANK3 does not include the defective block FBLK, the output signal of the first logic circuits 203 is set to "A_bank3"="0" and the bank address control signal is set to "BC3"="1". Thereby, the address counter 208 transfers bank addresses BA <4:6> and selects the bank BANK4.

Since the bank BANK4 includes the defective block FBLK, the output signal of the first logic circuits 203 is set to "A_bank4"="1". If the address counter 208 transfers bank addresses BA <4:6> to "100" and selects the bank BANK4, the bank selection signal becomes "A_BANK4"="1" and the bank address control signal becomes "BC3"="0".

Therefore, the control circuit 210 distinguishes whether or not each of the blocks BLK0 to BLK15 is the defective block FBLK one by one inside the bank BANK4 with reference to the data "A_i" which is latched on the data node N1 of the first defective block memory circuit 201.

If block addresses BA <0:3> are set to "0111" and the address counter 208 selects the block BLK7, since the block BLK7 is registered as the defective block FBLK at the data node N1 of the first defective block memory circuit 201 ("A_7"="1"), the control circuit 210 programs this address in the fuse circuit 117. After programming the address, the address counter 208 further increments block addresses BA <0:3>.

If block addresses BA <0:3> are set to "1101" and the address counter 208 selects the block BLK13, since the block BLK13 is registered as the defective block FBLK at the data node N1 of the first defective block memory circuit 201 ("A_13"="1"), the control circuit 210 programs this address in the fuse circuit 117. After programming the address, the address counter 208 further increments block addresses BA <0:3>, and the control circuit 210 distinguishes each block BLK one by one up to the last block BLK15 inside the bank BANK4.

If the control circuit 210 has distinguished whether or not each of the block BLK is the defective block FBLK up to the last block BLK15 inside the bank BANK4, the carry signal becomes "BCARY3"="1" and the bank address control signal becomes "BC3"="1" by the counter control circuit 209. Thereby, the address counter 208 transfers bank addresses BA <4:6> and selects the bank BANK5.

Since the bank BANK5 and the bank BANK6 do not include the defective block FBLK (the output signals of the first logic circuits 203 are set to "A_bank5"="0" and "A_bank6"="0"), the address counter 208 transfers bank addresses BA <4:6> and selects the bank BANK7 without incrementing the block addresses BA <0:3>.

If the address counter 208 transfers bank addresses BA <4:6> to "111" and selects the bank BANK7, since the bank BANK7 does not include the defective block FBLK ("A_bank7"="0"), the address counter 208 does not increment block addresses BA <0:3>. Moreover, since the bank BANK7 is the last bank in the memory cell array 106, the address counter 208 does not increment bank addresses BA <4:6> (Step S108).

If the last bank BANK7 includes the defective block FBLK ("A_bank7"="1"), after replacing the defective block FBLK with the redundant block RBLK, and block addresses BA <0:3> and bank addresses BA <4:6> reaches "1111111", or if the last bank BANK7 does not include the defective block FBLK ("A_bank7"="0") and the address counter 208 does not have to increment block addresses BA <0:3>, the control circuit 210 ends the defective block automatic replacement sequence as a chip PASS (Step S109).

As mentioned above, the NOR type flash memory 100 in accordance with the present embodiment can shorten the test time for the defective block automatic replacement sequence compared with the conventional sequence by adding the simple circuits inside the chip. As a comparative example, the conventional defective block automatic replacement sequence is shown in the flow chart of FIG. 14.

Figure 14:
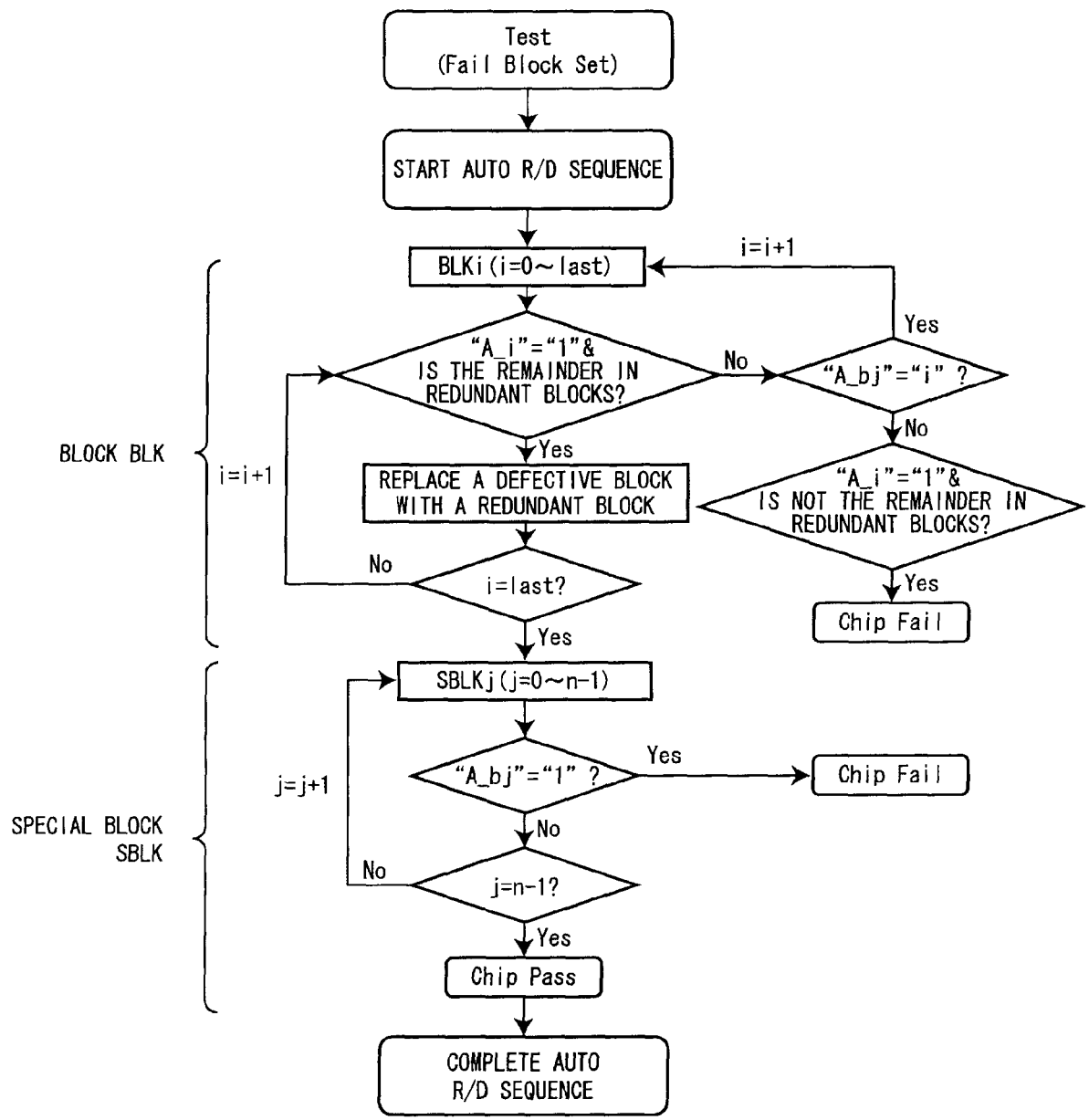
FIG. 14 is a flowchart of a defective block automatic replacement sequence on a NOR type flash memory in accordance with a comparative example.

In the defective block replacement sequence in accordance with the comparative example, as shown FIG. 14, the address counter increments the address from a head block BLK0 to a bottom block BLKbottom in the NOR type flash memory, and each time, the control circuit distinguishes whether or not the selected block BLK is the defective block FBLK and whether or not the redundant block RBLK which can be used for replacement remains.

If the selected block BLK is the defective block FBLK and the redundant block RBLK remains in the selected bank BANK, the control circuit replaces the defective block FBLK with the redundant block RBLK by programming the address of the defective block FBLK in the fuse circuit. On the other hand, if the selected block BLK is the defective block FBLK and the redundant block RBLK does not remain in the selected bank BANK, the control circuit ends the defective block replacement sequence as a chip FAIL.

Next, the address counter increments the address for the special blocks SBLK inside the NOR type flash memory, and each time, the control circuit distinguishes whether or not the selected special block SBLK is the defective block FBLK. If the special blocks SBLK include the defective block FBLK, the control circuit ends the defective block replacement sequence as a chip FAIL.

That is, even if the defective block FBLK does not exist in the memory cell array and the defective block replacement sequence is finally to be a chip PASS, the address counter has to increment the address about all the blocks BLK and all the special blocks SBLK, and each time, the control circuit has to distinguish whether or not the selected block BLK (selected special block SBLK) is the defective block FBLK.

According to the present embodiment, at least one of the following effects (1) to (4) is realized in relation to the comparison example above described.

(1): By arranging the first defective block memory circuit 201, the second defective block memory circuit 202, the first logic circuit 203, the second logic circuit 204, and the third logic circuit 205, if the defective block FBLK does not exist in the NOR type flash memory 100, the control circuit 210 is capable of omitting the judgment whether or not each of the block BLK is defective. Thereby, the time which the defective block automatic replacement sequence takes can be shortened.

(2): If the defective block FBLK exists between the special blocks SBLK, the control circuit 210 is capable of omitting the judgment whether or not each of the block BLK is defective. Thereby, the time which the defective block automatic replacement sequence takes can be shortened.

(3): In addition to effect (1), by further arranging the adder 206 and the comparator 207, if the number of the defective blocks FBLK is more than the number of the redundant blocks RBLK which can be used for replacement, the control circuit 210 is capable of omitting the judgment whether or not each of the block BLK is defective. Thereby, the time which the defective block automatic replacement sequence takes can be shortened.

(4): In addition to effect (3), by further arranging the address counter 208 and the counter control circuit 209, the control circuit 210 is capable of omitting the judgment whether or not each of the bank BLK is defective, and inspects only about the bank BANK where the defective block FBLK exists inside by incrementing block addresses BA <0:3>. Thereby, the time taken for the defective block automatic replacement sequence can be shortened.

Moreover, in the present embodiment, although the memory cell array 106 includes 8 banks BANK inside, the memory cell array 106 may include 16 banks BANK or more. Moreover, each of the banks BANK is not necessarily divided into equal storage capacity portions.

Moreover, in the present embodiment, although one block BLK has the storage capacity of 128 kB, one block BLK may have the storage capacity of 64 kB(s) or 256 kB(s) etc.

Moreover, in the present embodiment, although the NOR type flash memory 100 includes the BIST circuit 116 inside and judges whether or not the memory cell MC is defective based on the BIST sequence, the NOR type flash memory 100 may judge whether or not the memory cell MC is defective based on the test pattern inputted from an external tester without arranging the BIST circuit 116. According to the result acquired by using the test pattern inputted from the external tester, the NOR type flash memory 100 may set the data which is stored on the data node N1 of the first defective block memory circuit 201 and the data node N3 of the second defective block memory circuit 202.

Moreover, in the present embodiment, although the memory cell MC is capable of storing data in a non volatile manner based on the amount of electrons injected into the floating gate electrode, the memory cell MC may store data using change of the threshold voltage of the transistor based on the amount of electrons trapped in the nitride film as a charge storage layer.

Moreover, in the present embodiment, although the latch circuit shown in FIGS. 4A and 4B is used as the first defective block memory circuit 201 and the second defective block memory circuit 202, the first defective block memory circuit 201 and the second defective block memory circuit 202 may be constituted of various latch circuits or other type of circuits.

Moreover, in the present embodiment, although each of the banks BANK includes the redundant blocks RBLK inside, the redundant blocks RBLK may be independently arranged in another area outside of the bank BANK. Moreover, the special block SBLK may be constituted of a part of the (normal) blocks BLK which constitute the bank BANK. Moreover, at least one bank BANK may include a hidden block HBLK which is not usually used.

Moreover, in the present embodiment, although the banks BANK are arranged so that internal blocks BLK are arranged along the word line WL direction, the banks BANK may be arranged so that internal blocks BLK are arranged along the bit line BL direction.

Moreover, in the present embodiment, although the NOR type flash memory was illustrated as an example of a non-volatile semiconductor memory, other type of memories, such as NAND type flash memory, PRAM (Phase-change Random Access Memory), FeRAM (Ferro electric Random Access Memory), MRAM (Magnetic random Access Memory), and SRAM (Static Random Access Memory), ReRAM (Resistive Random Access Memory) may be utilized.

From the foregoing description, those skilled in the art can ascertain various changes and modifications without departing from the spirit and scope thereof, and it is understood that these changes and modifications are also included within the scope of claims.

The invention claimed is:

1. A non-volatile semiconductor memory comprising:
    a memory cell array including a plurality of banks, redundant blocks, and special blocks, each bank including a plurality of normal blocks, each normal block including a plurality of electrically rewritable memory cells and being a minimum unit which is independently erased, the special block storing management data, the redundant block configured to replace the normal block and being incapable of replacing the special block;
    a plurality of first defective block memory circuits configured to store data which indicates whether respective normal blocks include a defective memory cell;
    a plurality of second defective block memory circuits configured to store data which indicates whether respective special blocks include a defective memory cell;
    a plurality of first logic circuits configured to indicate whether respective banks include a defective memory cell based on the data stored in the plurality of first defective block memory circuits;
    a second logic circuit configured to indicate whether respective special blocks include a defective memory cell based on the data stored in the second defective block memory circuit; and
    a third logic circuit configured to indicate whether the memory cell array includes a defective memory cell based on signals outputted from the plurality of first logic circuits and the second logic circuit.

2. The non-volatile semiconductor memory according to claim 1, further comprising:
    an adder outputting a signal corresponding to a number of the normal blocks including a defective memory cell based on signals outputted from the plurality of first defective block memory circuits; and
    a comparator outputting a signal indicating whether a number of the normal blocks including the defective memory cell is more than a number of the redundant blocks which are capable of being used for replacement based on the signal which the adder outputs.

3. The non-volatile semiconductor memory according to claim 2, further comprising:
    an address counter generating a bank address by which any of the banks is to be selected and a block address by which any of the normal blocks is to be selected; and
    a counter control circuit controlling the address counter based on the signals which the plurality of first logic circuits output, the counter control circuit carrying the bank address without incrementing the block address for the bank which does not include the defective memory cell.

4. The non-volatile semiconductor memory according to claim 1, wherein the bank is a minimum unit to which data-writing and from which data-reading are executed simultaneously in parallel.

5. The non-volatile semiconductor memory according to claim 1, wherein the bank includes the redundant blocks, and the normal block including the defective memory cell is replaced with the redundant block arranged in the same bank.

6. The non-volatile semiconductor memory according to claim 1, wherein the data stored in the first defective block memory circuit is set based on whether the normal block includes the memory cell which is judged as defective in a test process, and the data stored in the second defective block memory circuit is set based on whether the special block includes the memory cell which is judged as defective in the test process.

7. The non-volatile semiconductor memory according to claim 1, wherein the special block is a boot block which stores preset information.

8. The non-volatile semiconductor memory according to claim 7, wherein a capacity of the boot block is smaller than a capacity of the normal block.

9. The non-volatile semiconductor memory according to claim 1, wherein the first logic circuit comprises an OR circuit of which input-signals are generated based on the plurality of first defective block memory circuits, and the second logic circuit is constituted by an OR circuit in which input-signals are generated based on the plurality of second defective block memory circuits.

10. The non-volatile semiconductor memory according to claim 9, wherein the third logic circuit comprises an OR circuit in which input-signals are transmitted from the plurality of first logic circuits and the second logic circuit.

11. The non-volatile semiconductor memory according to claim 9, wherein the non-volatile semiconductor memory comprises a NOR type flash memory and at least one of the memory cell is capable of storing multi bits data.

12. A method for replacing defective blocks of a non-volatile semiconductor memory including a memory cell array, the memory cell array including a plurality of banks, redundant blocks, and special blocks, each bank including a plurality of normal blocks, each normal block including a plurality of electrically rewritable memory cells and being a minimum unit which is independently erased, the special block storing management data, the redundant block configured to replace the normal block and being incapable of replacing the special block, comprising:

distinguishing whether a normal block includes a defective memory cell or a special block which includes a defective memory cell exists in the memory cell array;

if the normal block including the defective memory cell or the special block including the defective memory cell exists in the memory cell array, distinguishing whether the special block including a defective memory cell exits in the memory cell array;

if the special block including the defective memory cell does not exist in the memory cell array, distinguishing whether each of the normal blocks inside the bank includes a defective memory cell; and replacing the normal block including the defective memory cell with the redundant block.

13. The method for replacing defective blocks according to claim 12, further comprising:

if the special block including the defective memory cell does not exist in the memory cell array, distinguishing whether a number of the normal blocks including the defective memory cell is more than a number of the redundant blocks which are capable of being used for replacement.

14. The method for replacing defective blocks according to claim 13, further comprising:

if a number of the normal blocks including the defective memory cell is not more than a number of the redundant blocks which are capable of being used for replacement, distinguishing whether each of the normal blocks in the bank includes the defective memory cell.

15. The method for replacing defective blocks according to claim 14, further comprising:

not distinguishing whether each of the normal blocks includes the defective memory cell if there is no bank in which the normal block including the defective memory cell.

16. The method for replacing defective blocks according to claim 12, wherein the bank is a minimum unit to which data-writing and from which data-reading are executed simultaneously in parallel.

17. The non-volatile semiconductor memory according to claim 12, wherein each bank includes the redundant blocks, and the normal block including the defective memory cell is replaced with the redundant block arranged in the same bank.

18. The non-volatile semiconductor memory according to claim 12, wherein the special block is a boot block which stores preset information.

19. The non-volatile semiconductor memory according to claim 13, wherein a capacity of the boot block is smaller than a capacity of the normal block.

20. The non-volatile semiconductor memory according to claim 12, wherein the non-volatile semiconductor memory is a NOR type flash memory and at least one of the memory cell is capable of storing multi bits data.

21. A method of testing a semiconductor memory having banks containing blocks including data blocks and at least one redundant block, and having at least one management data block, comprising:

determining whether a defective block is present in a bank of the memory;

terminating the testing if no defective block is found;

determining whether the at least one management block in the bank is defective if a defective block is found;

determining the memory to be defective if the at least one management block is defective;

determining whether a first number of defective blocks is more than a second number of redundant blocks in the bank if the at least one management block is not defective;

determining the memory to be defective if the first number is greater than the second number; and replacing a defective block with one of the redundant blocks if the first number is not greater than the second number.

22. A method as recited in claim 21, further comprising:
repeating the replacing for a plurality of banks.

23. A method as recited in claim 21, further comprising:
incrementing a block address in the bank until an address of a first defective block is reached;
replacing the first defective block with one of the redundant blocks; and
repeating the incrementing until a last block address is reached and replacing any further defective blocks in the bank.

24. A method as recited in claim 21, further comprising:
arranging defective block memory circuits in the memory to determine whether a defective block is present in the banks; and
arranging a logic circuit in the memory, connected to the defective block circuits, to determine whether a defective block is present in the memory.

25. A method as recited in claim 24, further comprising:
arranging a plurality of first logic circuits to determine whether respective banks have a defective block;
arranging a second logic circuit to determine whether the at least one management block is defective; and
arranging a third logic circuit to determine whether any of the banks or whether the at least one management block is defective.

* * * * *